US011522566B2

(12) United States Patent
Pister et al.

(10) Patent No.: US 11,522,566 B2
(45) Date of Patent: Dec. 6, 2022

(54) CRYSTAL-FREE WIRELESS DEVICES

(71) Applicant: The Regents of the University of California, Oakland, CA (US)

(72) Inventors: Kristofer Pister, Orinda, CA (US); Osama Ullah Khan, Berkeley, CA (US); Bradley Wheeler, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 17/052,784

(22) PCT Filed: May 17, 2019

(86) PCT No.: PCT/US2019/032978
§ 371 (c)(1),
(2) Date: Nov. 3, 2020

(87) PCT Pub. No.: WO2019/222695
PCT Pub. Date: Nov. 21, 2019

(65) Prior Publication Data
US 2021/0234562 A1 Jul. 29, 2021

Related U.S. Application Data

(60) Provisional application No. 62/673,625, filed on May 18, 2018.

(51) Int. Cl.
*H04B 1/04* (2006.01)
*H04W 4/02* (2018.01)
*H04W 56/00* (2009.01)

(52) U.S. Cl.
CPC ............. *H04B 1/04* (2013.01); *H04W 4/023* (2013.01); *H04W 56/002* (2013.01); *H04W 56/0015* (2013.01)

(58) Field of Classification Search
CPC ....... H03K 3/0322; H04B 1/04; H04W 4/023; H04W 56/0015; H04W 56/002
(Continued)

(56) References Cited

U.S. PATENT DOCUMENTS 8,860,513 B1* 10/2014 Chong ................. H03K 3/0322
331/57
9,306,730 B1* 4/2016 Shu ........................ H03L 7/0814
(Continued)

FOREIGN PATENT DOCUMENTS

EP 2528255 A1 11/2012

OTHER PUBLICATIONS

Bell, "Bell's Law for the Birth and Death of Computer Classes: A theory of the Computer's Evolution," IEEE Solid State Circuits Society Newsletter, (2008), vol. 13, No. 4, pp. 88-94.
(Continued)

*Primary Examiner* — Tan H Trinh
(74) *Attorney, Agent, or Firm* — Venable LLP; Henry J. Daley

(57) ABSTRACT

A crystal-free wireless device includes a frequency calibration module and a local radio frequency (RF) oscillator having a first frequency and configured to communicate with the frequency calibration module. The crystal-free wireless device also includes a relaxation ring oscillator configured to communicate with the frequency calibration module. The relaxation ring oscillator is further configured to receive a calibration signal or periodic radio frequency packets from a wireless network and provide a reference signal to the frequency calibration module. The relaxation ring oscillator is a crystal-free oscillator. The frequency calibration module is configured to generate a calibration signal that is fed back through a Frequency Locked Loop (FLL) to the local RF
(Continued)

oscillator to calibrate the local RF oscillator. The calibrated local RF oscillator is configured to generate a clock signal.

10 Claims, 8 Drawing Sheets

(58) Field of Classification Search
USPC ......... 455/440, 85, 86, 115.1; 375/219, 376; 331/16, 25, 57, 66, 179
See application file for complete search history.

(56) References Cited

U.S. PATENT DOCUMENTS

| | | | | |
|---|---|---|---|---|
| 9,401,724 | B1* | 7/2016 | Gao | H03L 3/00 |
| 2004/0222856 | A1* | 11/2004 | Hein | H03L 7/235 331/16 |
| 2007/0096840 | A1* | 5/2007 | Williams, III | H03L 7/099 331/179 |
| 2008/0072025 | A1* | 3/2008 | Staszewski | G06F 9/30032 712/241 |
| 2008/0284530 | A1* | 11/2008 | Pellerano | H03L 7/0995 331/1 A |
| 2011/0309864 | A1* | 12/2011 | Yensen | G04G 3/04 327/151 |
| 2012/0289175 | A1* | 11/2012 | Vogas | H04B 7/0617 455/115.1 |
| 2013/0051439 | A1* | 2/2013 | Wu | H03L 7/0807 375/219 |
| 2013/0162356 | A1* | 6/2013 | Snowdon | H03L 7/089 331/25 |
| 2015/0015342 | A1* | 1/2015 | Huang | H03L 1/00 331/177 R |
| 2015/0349992 | A1* | 12/2015 | Gao | H04B 1/16 375/376 |
| 2016/0028405 | A1* | 1/2016 | Caffee | H03L 1/026 331/66 |
| 2017/0063387 | A1* | 3/2017 | Gao | H03B 5/1228 |
| 2018/0083809 | A1* | 3/2018 | Tajalli | H04L 25/14 |
| 2019/0280725 | A1* | 9/2019 | Pister | H03K 3/0315 |

OTHER PUBLICATIONS

Lee et al., "Ultra-low power circuit techniques for a new class of sub-mm3 sensor nodes," in IEEE Custom Integrated Circuits Conference, (2010) 8 pages.
Ju et al., "Clustered Data Collection for Internet of Batteryless Things," IEEE Internet of Things Journal, (Dec. 2017), vol. 4, No. 6, pp. 2275-2285.
Lee et al., "A Modular 1 mm3 Die-Stacked Sensing Platform With Low Power I2C Inter-Die Communication and Multi-Modal Energy Harvesting," IEEE Journal of Solid State Circuits, (Jan. 2013), vol. 48, No. 1, pp. 229-243.
Kim et al., "A millimeter-scale wireless imaging system with continuous motion detection and energy harvesting," in IEEE VLSI Circuits Digest of Technical Papers, Honolulu, HI, (2014). (2 pages).
Khan et al., "Frequency reference for crystal free radio," in IEEE International Frequency Control Symposium (IFCS), New Orleans, LA, (2016) 2 pages.
Paidimarri et al., "A 120nW 18.5kHz RC oscillator with comparator offset cancellation for ±0.25% temperature stability," in International Solid-State Circuits Conference Digest of Technical Papers, San Francisco, CA, (2013) 3 pages.
Griffith et al., "A 37?W dual-mode crystal oscillator for single-crystal radios," in IEEE international Solid-State Circuits Conference—(ISSCC) Digest of Technical Papers, San Francisco, CA, (2015) 3 pages.
Tokunaga et al., "An On-Chip CMOS Relaxation Oscillator VMth Voltage Averaging Feedback," IEEE Journal of Solid-State Circuits, (Jun. 2010), vol. 45, No. 6, pp. 1150-1158.
Sundaresan et al., "Process and temperature compensation in a 7-MHz CMOS clock oscillator," IEEE Journal of Solid State Circuits, (Feb. 2006), vol. 41, No. 2, pp. 433-442.
Lee et al., "A 10MHz 80?W 67 ppm/°C CMOS reference clock oscillator with a temperature compensated feedback loop in 0.18?m CMOS," in IEEE Symposium on VLSI Circuits, (2009) 2 pages.
Mesri, "Design and User Guide for the Single Chip Mote Digital System," (May 2016) 214 pages
Allan, "Conversion of Frequency Stability Measures from the Time-domain to the Frequency-domain, vice-versa and Power-law Spectral Densities," (Jan. 26, 2012) (9 pages).
Lechêne et al., "Organic solar cells and fully printed super-capacitors optimized for indoor light energy harvesting," Nano Energy, (Aug. 2016), vol. 26, pp. 631-640.
Shafiee et al., "Infrastructure Circuits for Lifetime Improvement of Ultra-Low Power IoT Devices," IEEE Transactions on Circuits and Systems I, (Sep. 2017), vol. 64, No. 9, pp. 2598-2610.
Ding et al., "A 95μW 24MHz digitally controlled crystal oscillator for IoT applications with 36nJ start-up energy and >13× start-up time reduction using a fully-autonomous dynamically-adjusted load," in IEEE international Solid-State Circuits Conference (ISSCC), San Francisco, CA, (2017) 3 pages.
Dujovne et al., "6TiSCH: deterministic IP-enabled industrial internet (of things)," IEEE Communications Magazine, (Dec. 2014), vol. 52, No. 12, pp. 36-41.
Wikipedia, "Speed," [Online]. Available: https://en.wikipedia.org/wiki/Speed. [Accessed Feb. 23, 2018] 1 page.
Kim et al.,"A 695 pW standby power optical wake-up receiver for wireless sensor nodes," in IEEE Custom Integrated Circuits Conference, San Jose, CA, (2012) 4 pages.

\* cited by examiner

CRYSTAL-FREE WIRELESS DEVICES

CROSS-REFERENCE TO RELATED APPLICATIONS

The present Patent Application is a National Stage Application of International Application No. PCT/US2019/032978, filed May 17, 2019, which claims priority benefit to U.S. Provisional Patent Application No. 62/673,625 filed on May 18, 2018. The present Patent Application is also related to PCT International Patent Application No. PCT/US2017/031596 filed on May 8, 2017 entitled "Crystal Free Radio" and to PCT International Application No. PCT/US2017/019721, filed on Feb. 27, 2017 entitled "Time Synchronized Networks of Wireless Nodes and the Wireless Nodes," the entire content of each is incorporated herein by reference. All references cited anywhere in this specification, including the Background and Detailed Description sections, are incorporated by reference as if each had been individually incorporated.

STATEMENT REGARDING FEDERALLY SPONSORED RESEARCH OR DEVELOPMENT

This invention was made with government support under HR0011-14-2-0001, awarded by the Defense Advanced Research Projects Agency (DARPA). The government has certain rights in the invention.

BACKGROUND

1. Field

The present application is directed to wireless sensors and wireless networks, and in particular to crystal-free wireless devices.

2. Introduction

Semiconductor technology is undoubtedly one of the greatest inventions of the 20$^{th}$ century if not the greatest. The 70 years of transistor evolution has fueled the semiconductor industry and resulted in an exponential growth. This exponential growth can be seen from the evolution of computing following Bell's law. With every new class of computing, the price is reduced by a factor of 10, the active power consumption is lowered by a factor of 100, and the scale is increased by a factor of 10. If this trend continues, it is clear that we are entering into an era where computing, sensing and communication is becoming disposable. This will enable the next level of scale, which is billions or trillions of these microsystems, in the next decade or so.

This trend in computing opens up many new opportunities as well as system design challenges. However, limited battery life and cost remain the major bottleneck in the proliferation of these micro-devices. Therefore, energy harvesting from ambient environments may be an attractive alternative option to provide power sources to these micro-devices. However, energy harvesting has to be economically viable to be commercially successful at scale. The economy of scale also requires that these emerging microsystems need to be low-cost (for example, less than $1). Therefore full system-integration on a single piece of silicon may be needed in order to further reduce the cost.

Monolithic integration also reduces the profile of these microsystems, a much desirable property. Achieving these goals will enable the vision of dynamic wireless networks.

Dynamic wireless networks are defined herein as self-awareness of the wireless network objectives and self-maintenance. For example, in a wireless sensor network self-maintenance could be as simple as placing an online order of fresh batteries that are delivered to the facility without any human intervention if the battery of a wireless sensor runs low. Alternatively, it could be as sophisticated as a drone or a robot working symbiotically with the wireless network, replacing the battery or perhaps deploying a new wireless sensor node without any human intervention.

The Internet-of-Things (IoT) promises one trillion wireless sensors in the next 10 to 15 years. It is expected for the wireless connectivity to be embedded into everyday objects that will allow us to collect data at high spatial and temporal resolution, create richer physical models, and manifest intelligent behavior that is highly dynamic in nature.

This staggering scale imposes new design and system challenges, namely battery-life, cost of wireless sensors at scale and wireless capacity. The ultimate goal is to reduce or minimize power consumption in these micro-devices and eventually lower cost without sacrificing any of the functionality accomplished by these devices, including wireless and wireless network functionality. Currently, there is no adequate technology or system that accomplishes this goal. Therefore, it remains desirable to provide wireless devices that minimize power consumption and use a battery-less source of energy to provide power to the wireless devices.

BRIEF DESCRIPTION OF THE DRAWINGS

The present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention.

Some embodiments of the invention are directed to a radio architecture that requires no external off-chip frequency reference. Some embodiments of the present inventions provide a standard compliant, low-power, low-cost, crystal-free wireless communication. The radio architecture can be used for low-cost, battery-less wireless sensors for Internet of Things (IoT) applications, for example. However, the general concepts of this inventions are not limited to only IoT applications.

The notion of time can play a role in any dynamic system. The dynamic wireless network, depending on the level of autonomy, can not only sense the environment but can also actuate and control the physical space that is being monitored. For any control algorithm, having an accurate sense of time may be needed for edge devices in the wireless network. In a typical microsystem, time is measured by counting a precise frequency reference generated using a very high-quality off-chip resonator, typically a crystal (XTAL) or a Micro Electro Mechanical System (MEMS) device that adds to the overall cost of these devices at scale. The cost of a XTAL is almost equal to the cost of the 2×2 mm$^2$ silicon and at high volumes (>100 M units) represents a significant fraction of the overall system cost.

Figure 1:
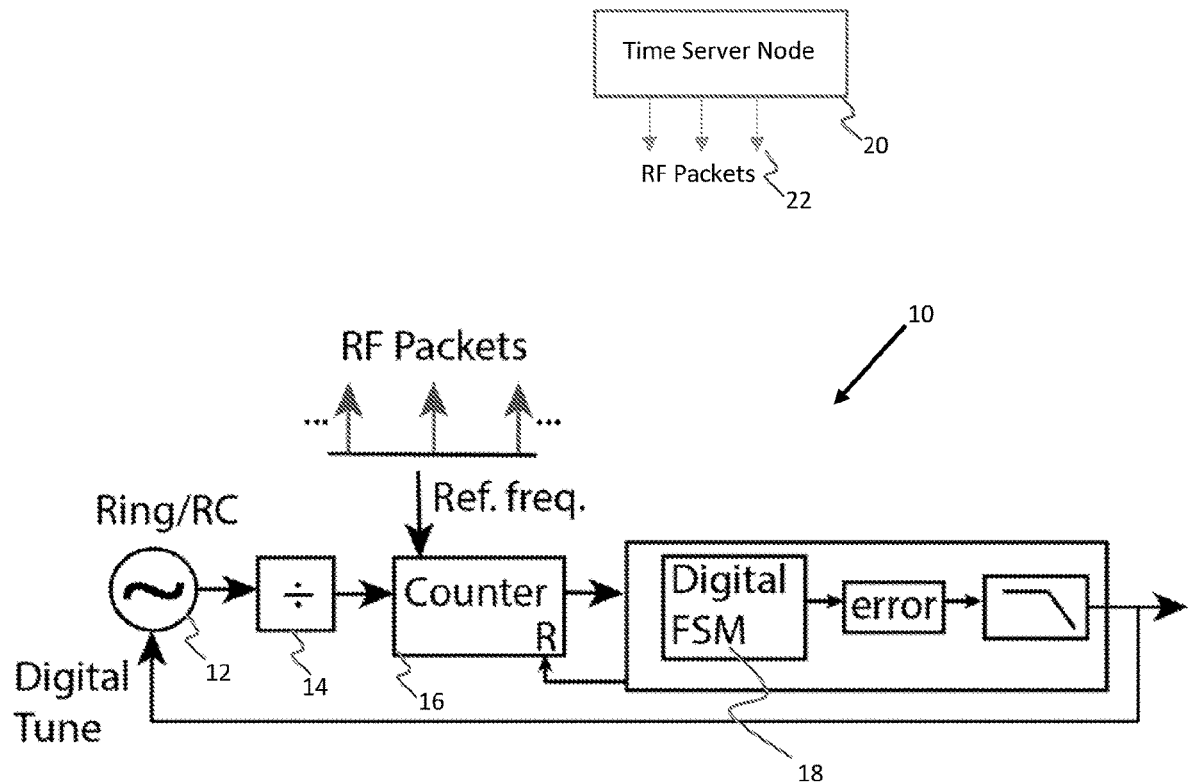
FIG. 1 depicts a schematic diagram of a wireless system for a crystal-free operation without using an external resonator, e.g., crystal (XTAL) or Micro-Electro-Mechanical Systems (MEMS), according to an embodiment of the present invention.

FIG. 1 depicts a schematic diagram of a wireless system 10 for a crystal-free operation without using an external resonator, e.g., crystal (XTAL) or Micro-Electro-Mechanical Systems (MEMS), according to an embodiment of the present invention. The wireless system 10 is a referenced Frequency Locked Loop (FLL) and is a node in the wireless network. The wireless system 10 comprises a relaxation oscillator (e.g., Ring/RC oscillator) 12 as a Digitally Controlled Oscillator (DCO). A frequency of the signal output by the relaxation oscillator 12 is divided down to a lower frequency by frequency divider 14 to be used as a clock source for an on-chip counter 16. One node 20 in the wireless network 10 can serve as a timeserver with a more accurate clock source as compared to crystal-free devices. The timeserver node 20 periodically sends RF packets 22 at regular time intervals. The periodic RF packets or network pings 22 serve as a timing reference for the FLL system 10. When an RF packet is received, the digital state machine (FSM) 18 stores a counter value and resets the counter 16. Since the RF packets 22 arrive at a predetermined timing interval, by receiving two consecutive packets, the crystal-free system 10 can compute the error on their local clock reference which is obtained by dividing the frequency of the relaxation oscillator 12. The computed error can then be averaged over several consecutive measurements and can be used to digitally calibrate the on-chip clock reference.

In another embodiment, the relaxation oscillator (e.g., Ring/RC oscillator) 12 can be replaced by a RF Local Oscillator (RF LO). Similarly to the above embodiment that uses the relaxation oscillator 12, the RF LO oscillator receives a signal or periodic radio frequency packets (e.g., RF packets 22) from a wireless network (e.g., time server node 20) and provides a reference signal to a frequency calibration module comprising the counter 16 and the digital Finite State Machine (FSM) 18. The frequency calibration module is configured to generate a calibration signal that is fed back to the RF LO to calibrate the RF LO. The RF LO is configured to generate a clock signal (e.g., a radio clock signal). In this embodiment of the system 10, the clock signal is generated from the RF LO oscillator calibrated frequency. The RF LO operates at a much higher frequency than the relaxation oscillator 12. This allows, for example, to achieve a better performance in terms of better jitter performance as compared to the embodiment of the system 10 that uses the relaxation oscillator 12. The clock signal can be generated by dividing the calibrated frequency of the RF LO using one or more frequency dividers.

Figure 2:
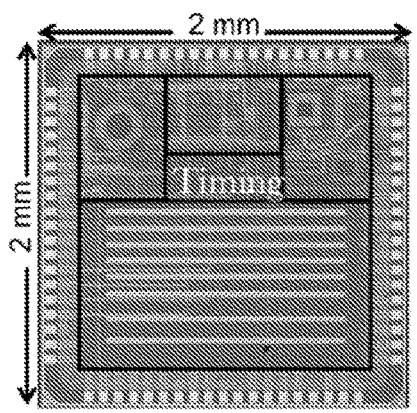
FIG. 2 depicts a die image of a test chip in 65 nm CMOS used to implement the system shown in FIG. 1, according to an embodiment of the present invention.

FIG. 2 depicts a die image of a test chip in 65 nm CMOS used to implement the system shown in FIG. 1, according to an embodiment of the present invention. In an embodiment, the CMOS chip (in 65 nm CMOS) is used to further validate and characterize the idea in silicon. The section labeled "Timing" in FIG. 2 generates all the on-chip clocks for the silicon-on-chip (SoC) from the calibrated reference from the ring/relaxation oscillator 12.

Figure 3:
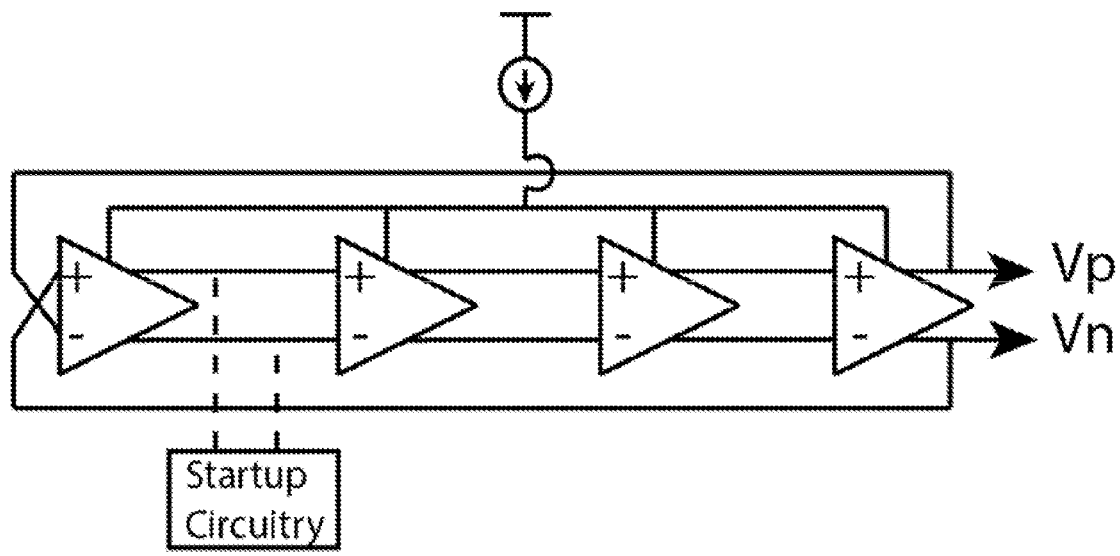
FIG. 3 is a schematic diagram of a differential 4-stage 25 MHz ring oscillator, according to an embodiment of the present invention.

In an embodiment, the ring oscillator 12 is implemented as a four-stage differential structure in 65 nm CMOS and designed to operate at 25 MHz reference frequency. FIG. 3 is a schematic diagram of a differential 4-stage 25 MHz ring oscillator 12, according to an embodiment of the present invention. The ring oscillator 12 occupies 0.025 mm$^2$ silicon area with a startup circuitry that is included to guarantee oscillation from cold-start.

In the embodiment shown in FIG. 1, ring oscillator 12 (in this example, a 4-stage 25 MHz ring oscillator) consumes approximately 7 µW of power and the frequency divider 14 is configured to divide the frequency reference of the signal from the ring oscillator 12 (e.g., 25 MHz) by 50 to generate a 500 kHz clock source for the on-chip counter 16. In an embodiment, no attempt is made to design the absolute best on-chip clock reference with superior supply and temperature sensitivity. In fact, the proposed calibration scheme can also calibrate the frequency changes due to on-chip supply and temperature variations. In an embodiment, the frequency reference is selected to satisfy different clocking requirements on the SoC. However, any other lower clock frequency reference can also be used for time-keeping depending on the application. In an embodiment, less than 1% per Volt supply voltage sensitivity and less than 1% temperature sensitivity can be achieved over a wide temperature range for on-chip relaxation/ring based oscillators.

Figure 4:
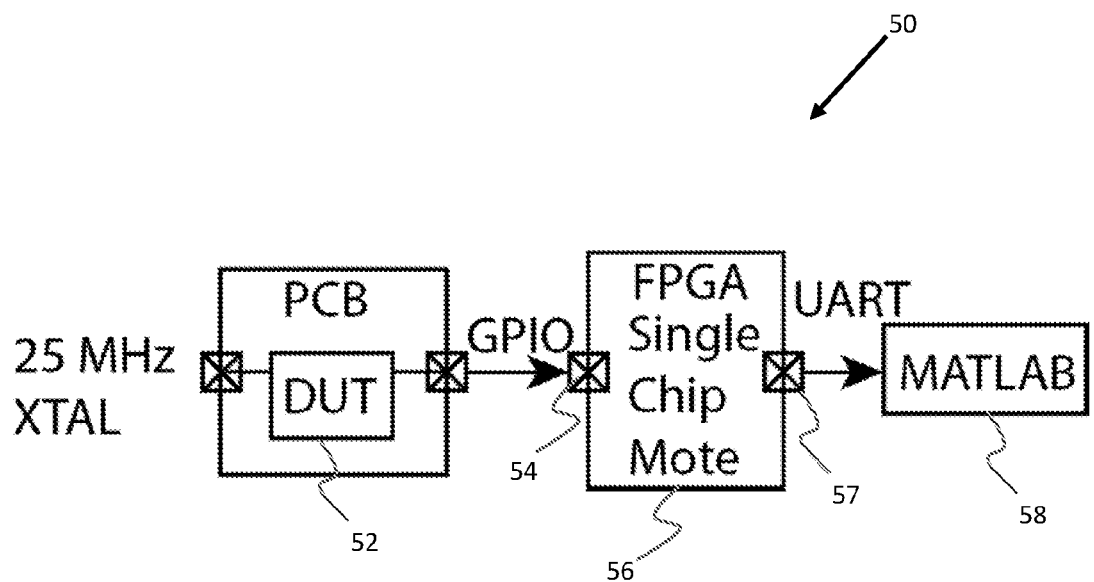
FIG. 4 depicts a set-up for measuring timing accuracy, according to an embodiment of the present invention.

In order to measure the timing accuracy of the on-chip 25 MHz reference, we setup an experiment. FIG. 4 depicts a set-up 50 for measuring timing accuracy, according to an embodiment of the present invention. A C-code is written and executed on the Device Under Test (DUT) 52 to toggle a General Purpose Input Output (GPIO) pin 54 every 100 ms using the on-chip 25 MHz reference as a clock source. For comparison, the DUT 52 can also be configured to use an external off chip 25 MHz crystal (XTAL) clock. The GPIO pin 54 is connected to a Field Programmable Gate Array (FPGA) 56. The FPGA 56 is used to measure the timing interval. The measurement data (including timing data) is transmitted over the Universal Asynchronous Receiver Transmitter (UART) 57 to be processed in a computer 58, using MATLAB for example. However, other software applications other than MATLAB can also be used. The FPGA 56, also referred to herein as named as Single Chip Mote (SCM), implements the digital system of the DUT 52 to facilitate testing.

Figure 5A:
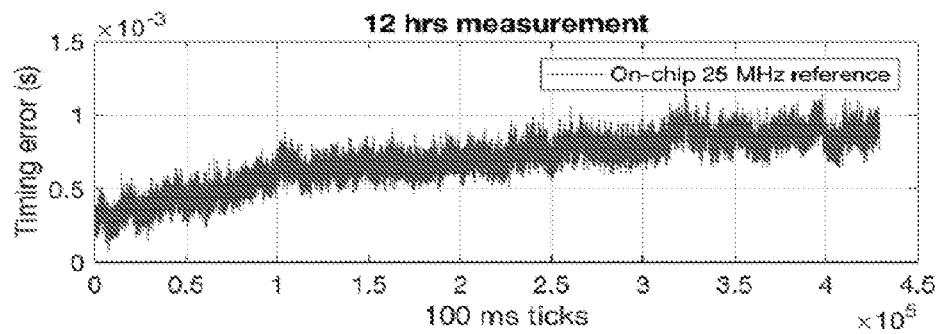
FIG. 5A is a plot of a timing error versus time due to a free-running 25 MHz reference, according to an embodiment of the present invention.
Figure 5B:
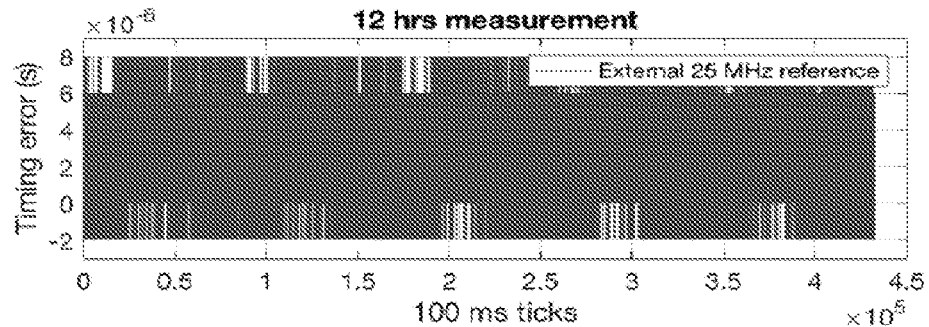
FIG. 5B is a plot of the timing error versus time due to an external 25 MHz crystal frequency reference, according to an embodiment of the present invention.

FIG. 5A is a plot of the timing error versus time due to the free-running 25 MHz reference, according to an embodiment of the present invention. The graph in FIG. 5A shows the measured timing accuracy over 12 hours at room temperature using the 25 MHz on-chip reference. FIG. 5B is a plot of the timing error versus time due to an external 25 MHz crystal frequency reference, according to an embodiment of the present invention. FIG. 5B shows the measured timing accuracy over 12 hours at room temperature using the 25 MHz crystal frequency reference. The vertical axis (y-axis) corresponds to the timing error and the horizontal axis (x-axis) corresponds to the measurement time period as a number of 100 ms ticks.

The timing accuracy is 3 orders of magnitude better with the XTAL clock as expected. The observed timing error using the on-chip 25 MHz reference is due to the random noise and deterministic environmental effects caused by the overnight temperature variation.

Figure 5C:
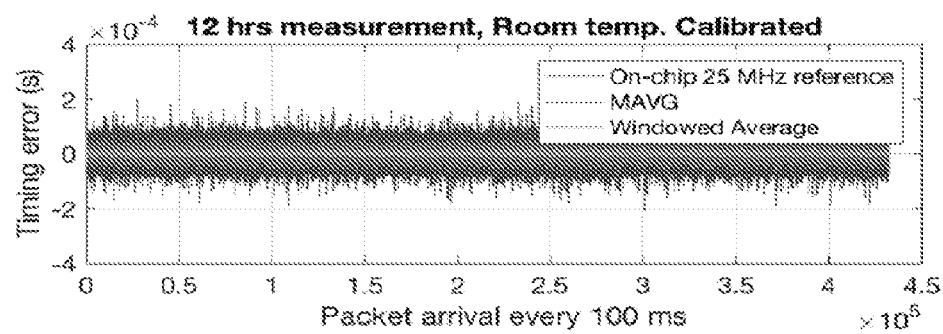
FIG. 5C is a plot of the timing error versus packet arrival every 100 ms, according to an embodiment of the present invention.
Figure 5D:
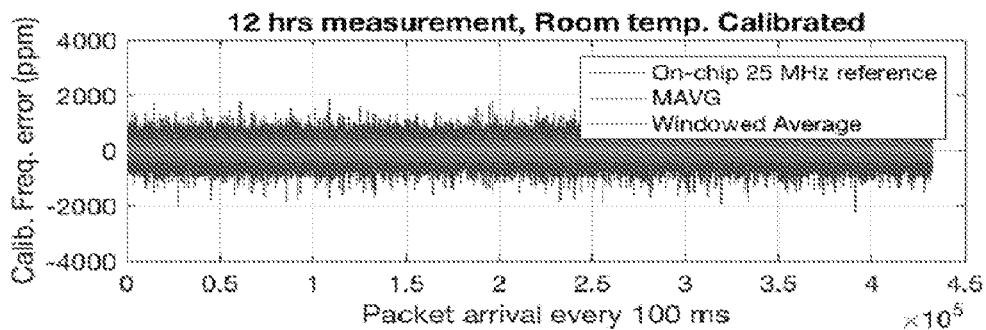
FIG. 5D is a plot of the calibration frequency error versus packet arrival every 100 ms, according to an embodiment of the present invention.

FIG. 5C is a plot of the timing error versus packet arrival every 100 ms according to an embodiment of the present invention. FIG. 5D is a plot of the calibration frequency error versus packet arrival every 100 ms, according to an embodiment of the present invention. The "noisier" exterior line in the plots corresponds to the on-chip 25 MHz reference, the interior line corresponds to a moving average (MAVG) and the line closest to zero corresponds the windowed average.

Figure 6:
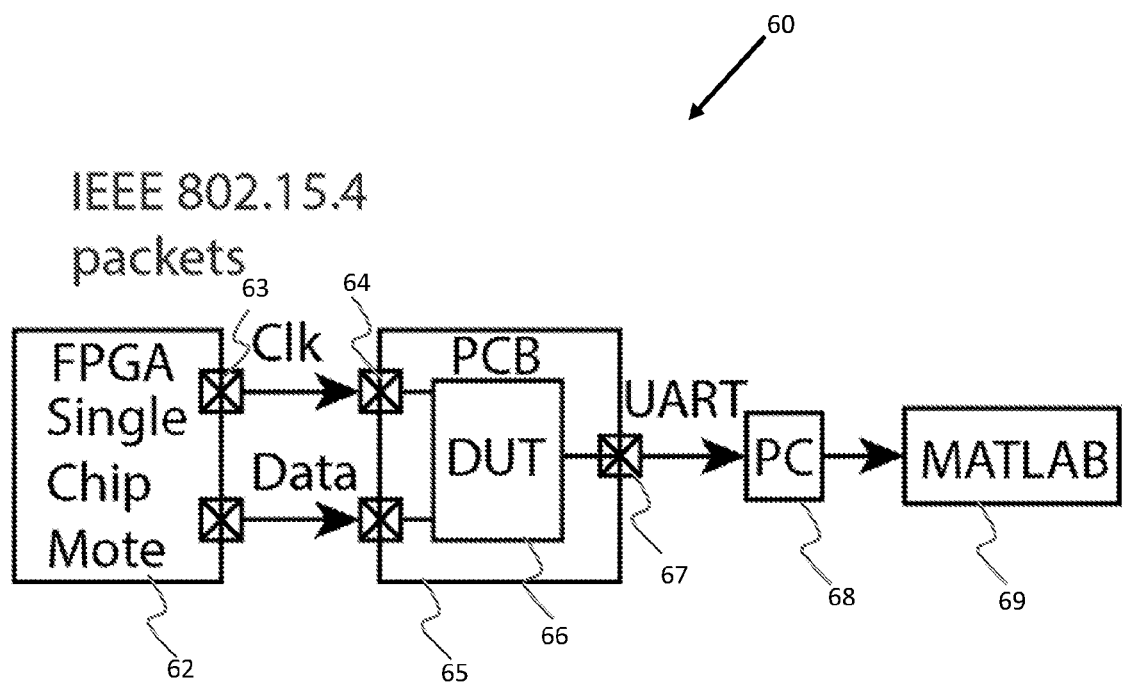
FIG. 6 depicts a schematic measurement setup for a wireless network referenced FLL, according to another embodiment of the present invention.

In order to verify the feasibility of the wireless network referenced FLL 10, a second experiment is performed using a setup shown in FIG. 6. FIG. 6 depicts a schematic measurement setup 60 for network referenced FLL 10, according to another embodiment of the present invention. As shown in FIG. 6, the FPGA 62 is configured to send periodic IEEE 802.15.4 standard compliant RF packets using clock wires 63 and data wires 64 directly connected to the test Printed Circuit Board (PCB) 65 hosting the Device Under Test (DUT) 66. This emulates a timeserver sending periodic RF packets. A software code (e.g., C-code) is written and executed on the DUT 66. The software code puts the DUT 66 into continuous receive mode. When an RF packet is received, the Finite State Machine (FSM) captures the timestamp of the event. The timestamp data is then transmitted over UART link 67 to a Personal Computer (PC) 68. A software code (e.g., Python script) is used to log the data and to store the data into a file to be processed in MATLAB 69, for example. Although the clock and data in FIG. 6 are delivered to the DUT 66 using wires, this does not impact the conclusion derived from the measured results. The RF channel delay spread can be on the order of 10 ns to 50 ns whereas the achieved timing accuracy is in μs. Therefore, the achieved calibrated frequency accuracy is not limited by the RF channel delay spread.

In an embodiment, by receiving two consecutive RF packets, the local clock error can be estimated. The local error is shown in the "exterior" plot labeled "On-chip 25 MHz reference" in FIG. 5C. The calibrated reference has a measured standard deviation of about 30.3 μs, which is mostly dominated by the white noise process. This curve corresponds to the output of the error module in the conceptual illustration of FIG. 1. Since the noise character is mostly white, averaging can further improve the mean frequency estimate of the on-chip frequency reference or reduce the variance of the timing error. Two low-pass finite impulse response (FIR) filters are explored. First, the cumulative moving average (MAVG) computes the mean of all the past samples up to the current sample (the interior plot in FIG. 5C labelled "MAVG"). Second, the windowed average computes the mean of the past M samples (plot labelled "Windowed Average" in FIG. 5C). For the windowed average, we arbitrarily choose M=10 (with 100 ms packet arrival this corresponds to computing the average of the past 1s time interval). The output of the two low-pass FIR filters is also plotted, and labelled as "Windowed Average," as shown in FIGS. 5C and 5D. The standard deviation reduced to 14.2 μs for the MAVG filter and 4.7 μs for the Windowed Average filter.

The Windowed Average performs better than the cumulative moving average MAVG because over long time intervals non-stationary noise sources (non-white character) can become dominant and cannot be reduced by averaging. The optimum filter duration for the Windowed Average can be found by measuring the Allan Deviation of the on-chip relaxation oscillator and corresponds to the averaging time interval over which the Allan Deviation is minimum.

The measured frequency of the on-chip relaxation oscillator is shown in ppm units in FIG. 5D. The measured ppm error after on-chip calibration is 303 ppm, 142 ppm for the MAVG and 47 ppm for the Windowed Average. Note that this achieved frequency accuracy corresponds to the mean frequency estimate of the on-chip frequency reference and does not correspond to its timing jitter performance which can be an order of magnitude higher and trades directly with power. This must be carefully evaluated for satisfying system jitter specifications of the on-chip clocks.

Figure 7:
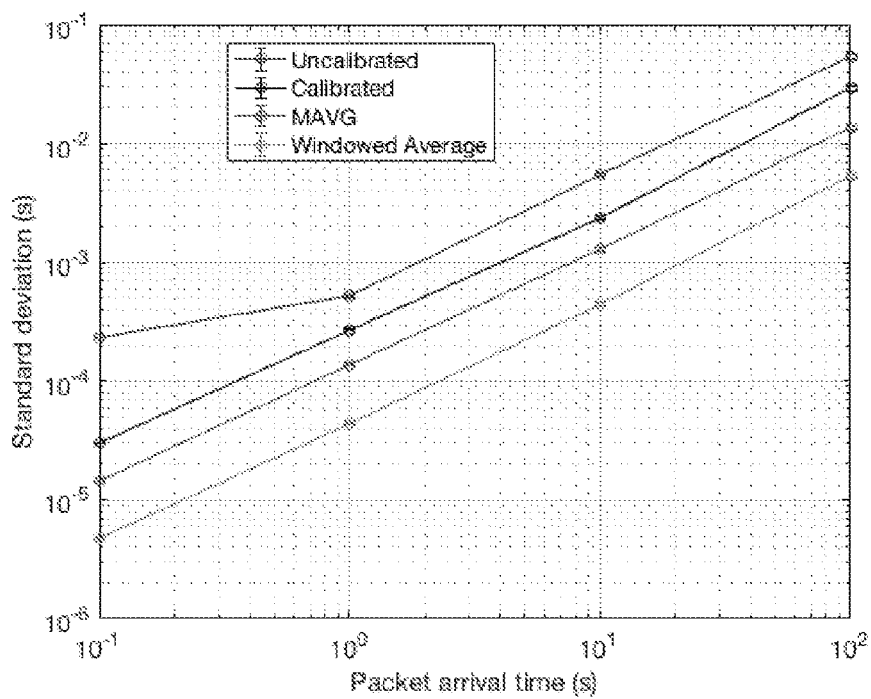
FIG. 7 shows a log-log plot of measured timing error (standard deviation) as a function of RF packet arrival time in seconds, according to an embodiment of the present invention.

The computed error estimate can be used to tune the on-chip Digitally Controlled Oscillator (DCO) using a feedback loop, as shown conceptually in FIG. 1. Alternatively, a timing calibration can be applied digitally using a feedforward lookup table approach. Since the on-chip frequency reference is free running during the network pings or the periodic RF packets, it is expected that the timing error will increase as the RF packet arrival time increases. FIG. 7 shows a log-log plot of the measured timing error (standard deviation) as a function of the RF packet arrival time in seconds, according to an embodiment of the present invention. The plot shows the clock's free-running time keeping ability as a function of the synchronization interval. The clock time-keeping ability over a time-interval τ is given by the following equation (1).

$$x_p(\tau) = k\tau\sigma_y(\tau) \quad (1)$$

where k depends on the noise character dominant over the measurement time interval τ and $\sigma_y(\tau)$ is the Allan Deviation (ADEV) of the reference clock.

Due to the non-stationary nature of the noise-sources, it becomes very difficult to come up with an accurate analytical expression for the time-keeping ability of a given clock source. Therefore, we have resorted to the empirical results in the FIG. 7. At is time interval, the standard deviation for the Windowed Average is roughly about 45 µs. This means that if the edge devices in the network sleep for is then the six sigma timing uncertainty is about 270 µs. Therefore, a 1 ms guard time may be more than sufficient to maintain synchronization. A 1 ms guard time and assuming 1 ms of radio packet duration, would correspond to 0.2% radio duty cycle for every is synchronization interval. If the active radio power is 1 mW then this corresponds to an average power consumption of just 2 µW. This power consumption by the edge device is relatively small allowing operation from harvested energy without any battery even from indoor lighting conditions at 300 lux. The term "harvested energy" is used herein to broadly mean any ambient energy that can be captured or harvested including for example, ambient lighting, electromagnetic energy, solar energy, kinetic energy, thermal energy, etc., but without using battery energy.

It is interesting to note that a linear relationship is observed between the guard time (proportional to the standard deviation) and the synchronization interval (packet arrival time) in the log-log plot of FIG. 7 over the measured timescales dominated by the white noise. The duty cycle may be limited by the fraction of the time the radio has to stay on for a given sleep interval to maintain synchronization. Increasing the synchronization interval, for example by a factor of 10, also increases the guard time by the same factor and therefore does not help to lower the radio duty cycle and to reduce the average power. A sub-linear relationship would have helped to reduce the average radio power by further increasing the synchronization interval.

Figure 8:
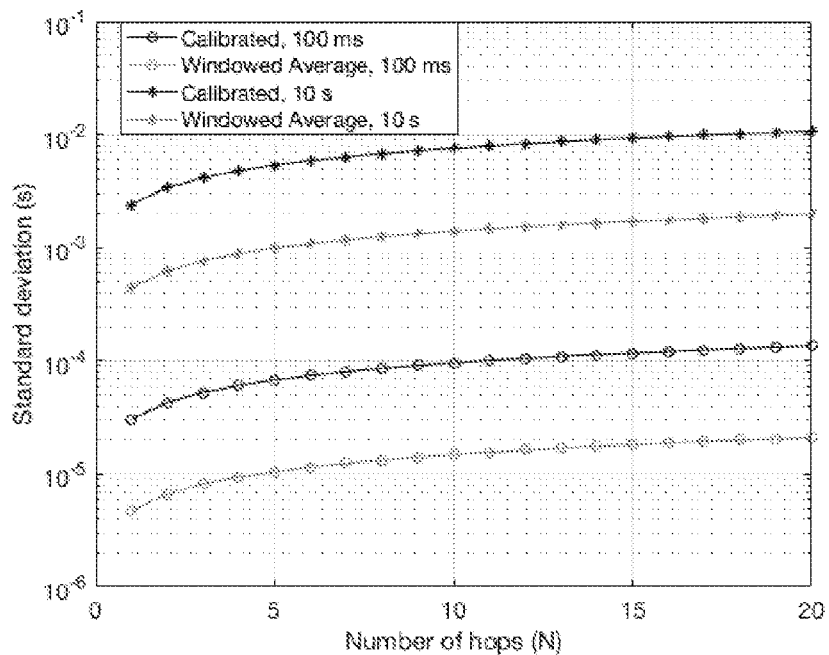
FIG. 8 depicts a plot of a standard deviation error as a function of a number of hops or hop count in a multi-hop mesh wireless network configuration, according to an embodiment of the present invention.

A benefit of using a low-Q on-chip relaxation oscillator (e.g., RC oscillator) 12 (shown in FIG. 1) as a timing and frequency reference as compared to an off-chip high Q resonator (XTAL/MEMS) is that the system 10 (shown in FIG. 1) can be duty cycled very quickly which can be a desirable property. The startup time of a crystal oscillator can easily take up to 1 ms or longer. This directly saves energy and reduces the average power of the crystal-free devices. The timing error can be dominated by a white noise process over the measured synchronization intervals. Therefore, if the crystal-free devices 10, which do not have any external resonator (XTAL/MEMS) themselves, acts as time-servers, then the timing error will grow as $\sqrt{N}$, where N is the hop count in a multi-hop mesh network, as shown in FIG. 8. FIG. 8 depicts a plot of the standard deviation error as a function of a number of hops or hop count in a multi-hop mesh network configuration, according to an embodiment of the present invention. For a 1 second synchronization interval and a 10-hop network, the six sigma timing accuracy would be about 853.8 µs sufficient for a 1 ms guard time interval.

Figure 9:
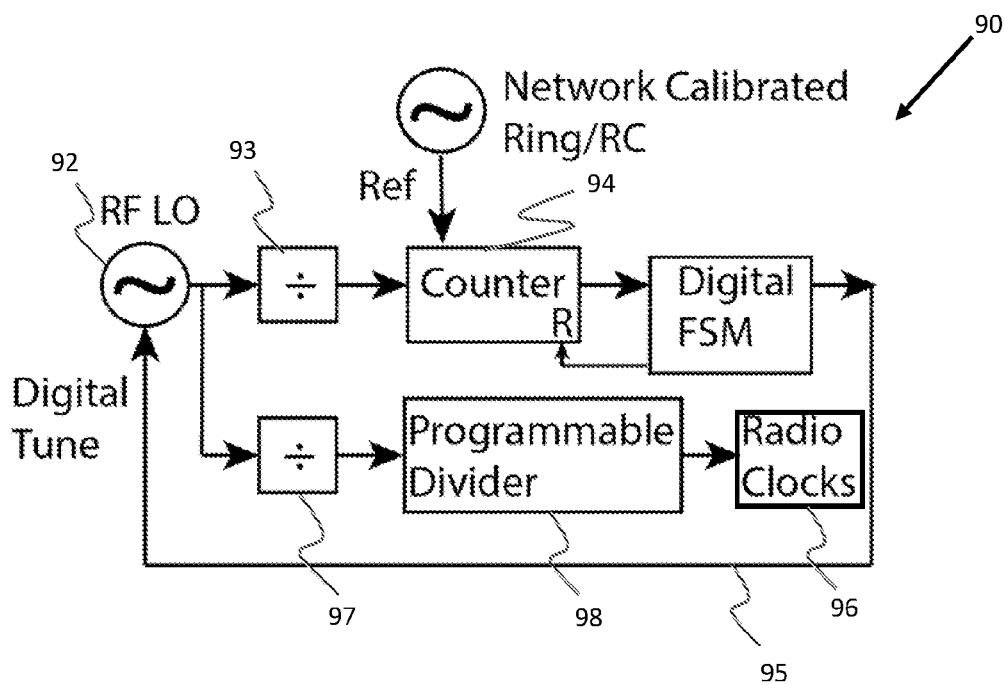
FIG. 9 shows a schematic diagram of an RF oscillator frequency calibration set up using a Frequency Locked Loop (FLL), according to another embodiment of the present invention.

FIG. 9 shows a schematic diagram of an RF oscillator frequency calibration set up 90 using a Frequency Locked Loop (FLL), according to another embodiment of the present invention. The 47 ppm achieved frequency accuracy on the network calibrated on-chip frequency reference allows us to use it as a reference to calibrate the frequency of a RF Local Oscillator (LO) 92 in the field. The RF frequency can be divided down using a frequency divider 93. The divided frequency is then measured using an on-chip counter 94 and calibrated using a Frequency Locked Loop (FLL) 95 as shown in FIG. 9. Alternatively, instead of using the network calibrated relaxation oscillator 92, the periodic RF packets can also be used as a precise timing reference on-chip to calibrate the RF LO, similarly as shown in FIG. 1.

The calibrated RF LO 92 (shown in FIG. 9) or the network calibrated relaxation oscillator 12 (shown in FIG. 1) can be used to generate all the radio relevant clocks 96 (e.g., symbol clock 2 MHz for the IEEE 802.15.4, 1MHz for the BLE, ADC clock, discrete time signal processing and the digital baseband processor clock, etc.). However, since the RF LO 92 is a resonant oscillator, it has superior jitter performance and therefore may be a preferred source for generating all the radio clocks, as shown in FIG. 9. For example, this can be done by dividing the calibrated frequency of the RF LO 92 using frequency divider 97. The divided calibrated frequency signal is then sent to programmable divider 98 to generate the various clock signals.

A typical wireless sensor node uses at least one XTAL oscillator. The XTAL oscillator is either used as a Real Time Clock (RTC) or as a high frequency reference for the wireless communication. In either case, the off-chip XTAL resonator adds to the Bill-Of-Material (BOM) cost and increases the profile of the wireless sensors. The state of the art RTC consumes power in the nanowatts. However, the high-frequency XTAL oscillator for the wireless communication can easily consume up to 100 µW of active power. The above frequency calibration method therefore reduces the power, cost and profile of the wireless sensor nodes. Although the achieved calibrated on-chip frequency accuracy may not equal to a XTAL frequency reference, it is sufficient to support scalable multi-hop wireless mesh networks using narrow band radios. The proposed method uses a periodic RF traffic, which is not a concern in a dynamic network where the inherent network data traffic provides frequency synchronization. In networks where there is not enough data traffic, the cost of frequency synchronization is negligible. Assuming a 1 ms RF packet sent every 10 s and 1 mW of active radio power, this would correspond to 100 nW of average power due to frequency calibration. The leakage power on modern silicon-on-chips (SoCs) can easily exceed this number so the proposed frequency calibration method does not have a significant impact on battery life.

In an embodiment, the RF LO 92 operates only when driving the frequency calibration module (including the counter 94 and the Digital FSM) when receiving the packets and thus is power active only during specific time periods. Assuming a 1 ms RF packet sent every 10 s and 1 mW of active radio power, for example, this would correspond to 100 nW of average power due to frequency calibration. The low frequency radio clocks are derived from the RF LO during the RF packet transmission or reception. The radio clocks are used for wireless communication and can be derived opportunistically when the RF LO is active. The radio clocks can also be derived from the network calibrated low frequency RC/ring oscillator by sacrificing jitter performance for lower active power.

When the wireless connectivity finds itself embedded into everyday objects, the amount of data generated is also expected to increase. To put numbers into context, the Visa Inc. handles on average about 2000 transactions per second, which is the data generated by interaction with just one smart object. To handle the increase data generated by human and machine-to-machine interaction, the edge nodes in the wireless network are expected to process the data locally due to energy efficiency, wireless capacity and latency reasons. The wireless network is expected to provide real-time data visibility of physical spaces and sends relevant contextual alarms to the cloud infrastructure.

Figure 10:
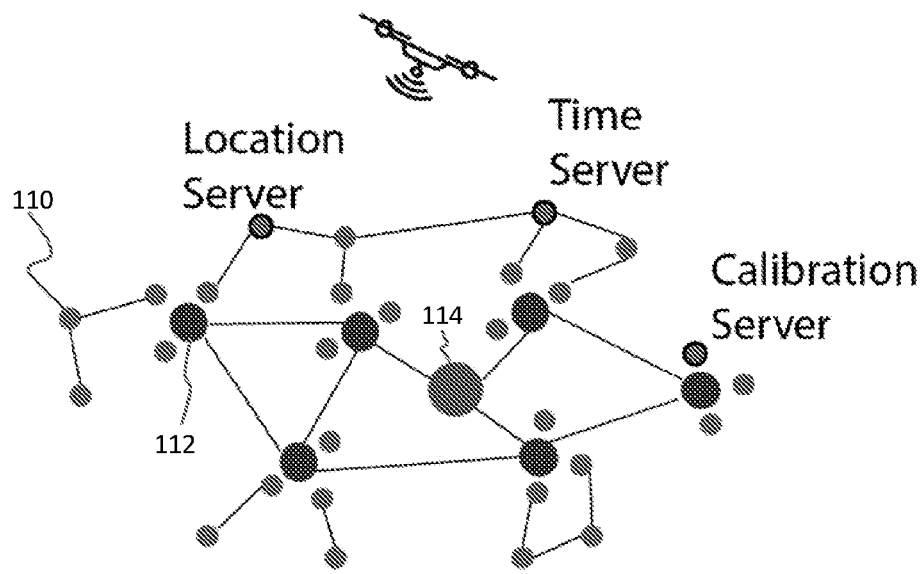
FIG. 10 depicts an example wireless network topology, according to an embodiment of the present invention.

FIG. 10 depicts an example network topology, according to an embodiment of the present invention. The gateway serves as a data sink and provides the cloud connectivity. Since the edge devices 110 are expected to operate from sources with limited energy capacity, e.g. printed batteries or batteryless operation from harvested energy, the edge devices 110 are expected to be less robust to interference. The robustness to interference needs relatively high linearity in the analog/RF front-end and is typically traded with power or high quality off-chip passives that adds to the cost of these devices. Both tradeoffs are not desirable for the edge devices 110. Therefore, we expect the edge devices to communicate with access points 112. These access points 112 are robust to interference at the cost of increased power consumption. The access points 112 can form a wireless mesh network with neighbors and consume data locally from the edge devices 110 to increase wireless network capacity. The edge devices 110 can also form a wireless mesh network with their neighbors, as shown in FIG. 10. In an embodiment, the access points 112 can be connected to a gateway device 114. In some embodiments, different wireless nodes can be configured to provide different wireless network services. For example, some wireless nodes can be Location servers for indoor positioning, Timer servers for frequency calibration and Calibration servers for the sensors, etc.

In an embodiment, the edge devices 110 can be wireless sensors such as physical and/or chemical sensors that can be deployed throughout a selected area, i.e., at various locations in the selected area. The physical sensors can be, for example, temperature sensors, vibration sensors, pressure sensors, position sensors, movement sensor, speed sensors, acceleration sensors, etc. The chemical sensors can be, for example, pH sensors or gas sensors such as oxygen sensors, carbon monoxide sensors, carbon dioxide sensors, etc. Each individual sensor is configured to measure the physical and/or chemical properties (temperature, pressure, etc.) at its location. Local averages or any other statistical measure e.g. mean, mode, median, max, min, standard deviation, histogram, moving average, weighted windowed average, FIR, IRR, FFT or any other filtered response etc. of the measured physical properties and/or chemical properties (e.g., temperature, pressure, etc.) are computed from the ensemble of Nhop wireless sensors within a single hop communication range or within multiple hops communication range. The local averages or any other statistical measure can provide a measurement baseline that reduces the measurement noise. If there is a local event that generates a measurement that deviates from the baseline (for example, a temperature rise), a sensor at the location where the event occurred can detect the event and can create a local signature. The local signature can also be a function of an ensemble of N wireless sensors within a single hop communication range or within multiple hops communication range and the spatial and temporal configuration of the wireless network and its real time sensor data. More generally, the event can also be a value that exceeds a detection threshold. The threshold can be set as the baseline or to a value other than the baseline, for example, depending on the desired detection sensitivity. In an embodiment, the local signature can be function of the configuration of the network. Artificial Intelligence (AI) can be used to predict network measurement (e.g., measurement of temperature) or can be used to predict the probability of a future event or can detect an event by recognizing its signature based on historical data acquired from previous sensor measurements.

In an embodiment, the edge devices 110 can be configured to stream data in real-time. The data is transmitted to the gateway device 114 via, for example, the access points 112. As the gateway device 114 is the data bottleneck and is limited in data bandwidth, the edge devices 110 can be configured to compress data locally. For example, the compression can be event based communication between the edge devices 110 and the gateway 114. That is, an edge device remains "silent" and does not transmit data to the gateway 114 when no event is detected and only transmits a packet of data to the gateway 114 when an event is detected. The term "event" is used herein to mean an event that deviates from the baseline or a value that exceeds a detection threshold or a local signature of an event is detected. The threshold can be set as the baseline or to a value other than the baseline, for example, depending on the desired detection sensitivity.

Figure 11:
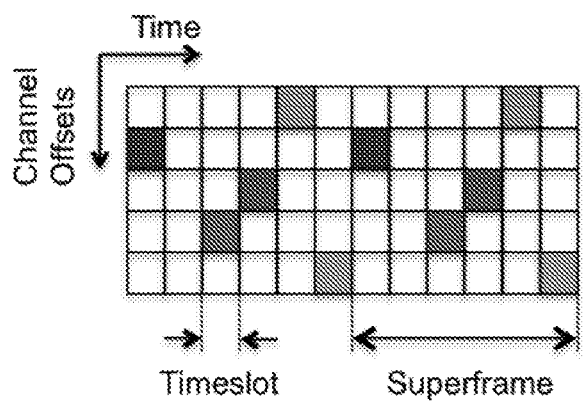
FIG. 11 depicts schematically an example schedule for different time slots, according to an embodiment of the present invention.

The wireless network shown in FIG. 10 is assumed to have a shared sense of time and a global schedule for communication. A schedule coordinates all of the communication in a Time Synchronized Channing Hopping (TSCH) network. The time is divided into timeslots and in each timeslot a node can transmit, receive, or sleep. A timeslot is long enough for a radio to send a packet and receive an acknowledgement. Therefore, both radio transmission and reception events can happen within a timeslot per device. For each transmit or receive slot, the schedule also indicates the neighbor node to communicate with, and a channel offset to communicate on. To increase throughput of the wireless network, more timeslots need to be scheduled but at the cost of increasing the average power consumption of the nodes. A collection of consecutive time slots form a super frame that repeats indefinitely till the lifetime of the wireless network. FIG. 11 depicts schematically an example schedule for different time slots, according to an embodiment of the present invention. FIG. 11 depicts a grid of channel offsets and timeslots. The vertical axis of the grid represents rows of channel offsets and the horizontal axis represents columns of time slots. In the example shown in FIG. 11, six timeslots form a superframe that repeats indefinitely. Each row represents a different channel offset. The wireless network can be configured so that multiple communications can happen in the wireless network at the same time, but on a different channel offset without interference.

Since the edge devices (which can be disposable) in the wireless network have finite lifetime (lasting few months up to several years), the edge devices are expected to join and leave the wireless network dynamically. Therefore, the wireless network needs to allocate sufficient resources to discover new devices (when the new devices are added to the wireless network) and dynamically adjust wireless network topology to maintain a certain quality of service. One possibility is to use the time synchronization periodic RF packets to sample the RF space for device/network discovery as well.

In our implementation, when an edge device wakes up from cold start, its local clock can be off by as much as ±5000 ppm, as shown in FIGS. 5A-5D. This means over a one second time interval the edge device's clock will accumulate about ±5 ms of timing error. If the periodic RF packets are sent every one second with a slot duration of 10 ms, and if the edge device wakes up every one second for 10 ms, then the edge device is guaranteed to find the wireless network in 100 s. This will correspond to 1% radio duty cycle during network discovery. If this latency is unacceptable and if sufficient energy is available either from the battery or the energy harvester then the device can listen continuously up to a second to find the wireless network pings.

Figure 12:
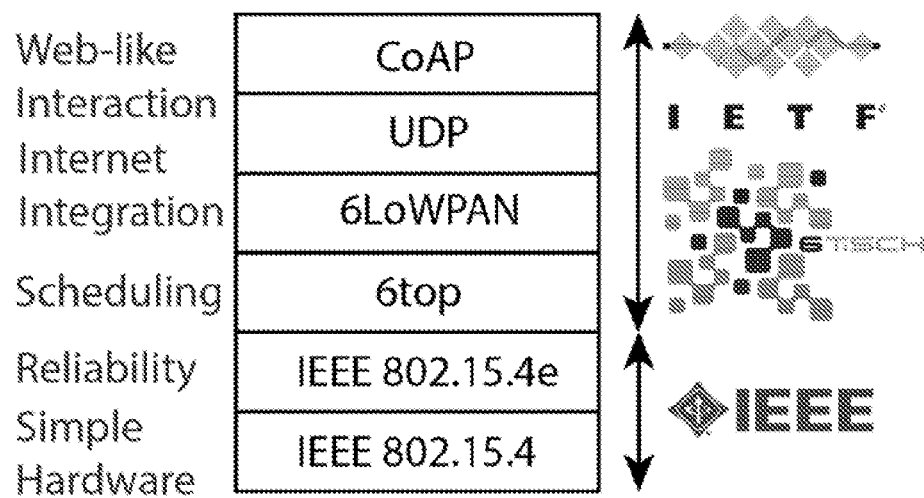
FIG. 12 depicts a high level diagram of a networking stack, according to an embodiment of the present invention.

FIG. 12 depicts a high level diagram of a networking stack, according to an embodiment of the present invention. In an embodiment, the networking stack can employ all open-source and standards' compliant, as shown by the various layers of the wireless network. The IEEE 802.15.4 PHY layer allows implementing ultralow power and low cost wireless sensors. The IEEE 802.15.4e defines the MAC layer, 6top provides a communication schedule, 6LoWPAN allows IPv6 integration and UDP and CoAP provides web like interaction. Since the edge devices supports IPv6 packets they can be easily integrated with a cloud infrastructure to collect real time data of physical spaces.

A dynamic network would require a dynamic communication schedule (in contrast to a static communication schedule discussed in the previous section) to accommodate changes in the wireless network topology due to mobility, finite node lifetime, data traffic and interference. One possibility is to assume every node in a wireless network has an independent schedule and the nodes negotiate with their neighbors to find a common communication channel (time slot and frequency offset). This may require the nodes to share their schedule with their neighbors. If we assume every node to have a fixed superframe length of for example one second with 10 ms timeslots, then each node can accommodate 1600 users with 16 RF channels for the IEEE 802.15.4 PHY. When a node wakes up, it starts scanning for the network beacons. If it doesn't find any network beacon it can then start broadcasting its own beacon to find neighbors. The network beacons can be broadcast at a predetermined set of frequencies and time interval.

Figure 13:
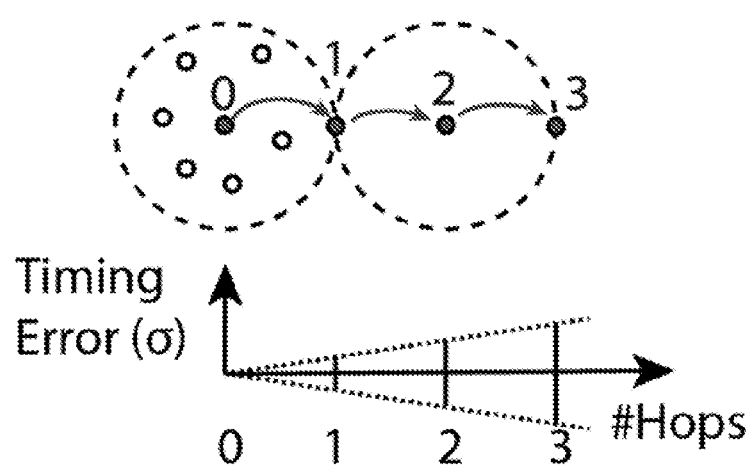
FIG. 13 depicts a schematic diagram of an example network topology having a plurality of nodes illustrating a growth of timing error with increasing number of hops, according to an embodiment of the present invention.

When a device discovers a wireless network through beacons then it negotiates a common communication schedule. There could be many edge cases that needs to be addressed before this could enable a completely decentralized dynamic schedule. FIG. 13 depicts a schematic diagram of an example network topology having a plurality of nodes illustrating a growth of timing error with increasing number of hops, according to an embodiment of the present invention. Node 0 is broadcasting network beacons and simultaneously serving as a time server. Node 1 is receiving timing synchronization from Node 0 and serving as a time server for Node 2 which in turn is a time server for Node 3. As shown in FIG. 13, the timing error grows as the number of hop count increases as discussed in the previous section.

Figure 14:
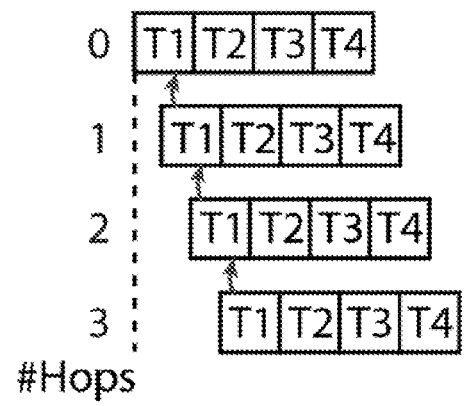
FIG. 14 is a diagram showing a result of having a timing error between nodes, according to an embodiment of the present invention.

FIG. 14 is a diagram showing a result of having a timing error between nodes, according to an embodiment of the present invention. As shown in FIG. 14, the timing error between the nodes will result in a relative shift in the communication schedule. If we assume that the Node 0 has the most accurate clock in the wireless network then the timing error between Node 3 and Node 0 could be larger than a time slot (10 ms) or several time slots. However, the communication between Node 3 and Node 0 can still happen as the relative timing error between one hop neighbors is bounded to be less than a guard time interval. This can extend the communication distance to arbitrary hops as long as the nodes' schedules are in time-sync with their immediate neighbors. However, applications that needs a precise time-stamp for sensor data or for control applications may dictate an upper limit on the absolute timing error that can be tolerated on the edge devices and in turn may limit the number of hops.

In a dynamic wireless network, we expect the edge devices to be mobile. The mobility of wireless nodes in a wireless network requires dynamic network topology. The rate of mobility (speed) can have a direct impact on the network average power consumption, as the RF space needs to be sampled more frequently to adapt the wireless network topology. This presents a challenging resource optimization problem in energy constraint environments, which is an open area of research. In order to discover a mobile device, we assume at least four communication events happen and the mobile device should cover a distance no more than a communication range of a single device which we can assume 20 m, for example. The four events are as follows:

a) The mobile device discovers the wireless network and requests to join the wireless network;
b) The wireless network authenticates the mobile device and responds with a schedule;
c) The mobile device finds a common communication channel and respond to the wireless network;
d) The wireless network acknowledges and accepts the new schedule.

Figure 15:
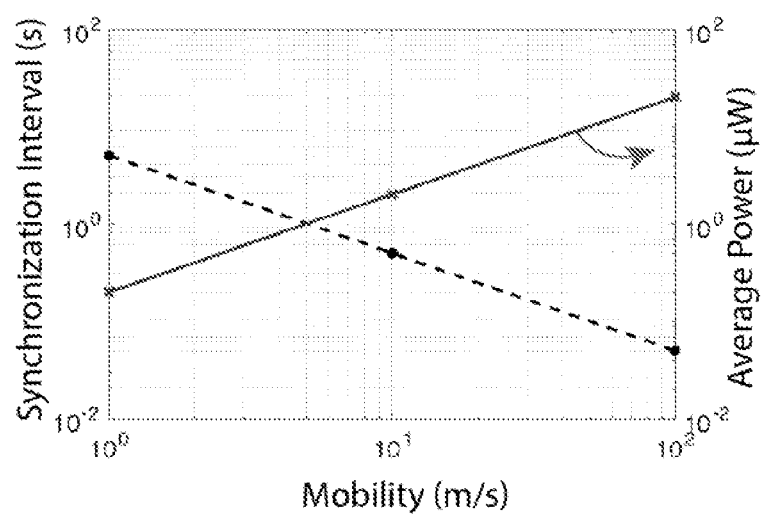
FIG. 15 is a plot of a synchronization interval (in seconds) and average power consumption (in µW) versus a mobility speed (in m/s), according to an embodiment of the present invention.

All these events can happen on the network beacon channel. We calculate the synchronization interval needed for different mobility rates and its impact on the average power consumption. FIG. 15 is a plot of a synchronization interval (in seconds) and average power consumption (in μW) versus a mobility speed (in m/s), according to an embodiment of the present invention. For example, a 10 m/s mobility corresponds to an average power consumption of 2 μW (assuming 1 mW of active radio power and 1 ms RF packet duration) for a synchronization interval (beacon rate) of 500 ms. For reference, a brisk walk is about 1.7 m/s and the sprint runners are about 12.2 m/s. However, the scalability of this approach in different RF traffic environments may need to be addressed in different scenarios and configurations.

In the example wireless network shown in FIG. 10, the firmware updates can be pushed to the network Over-The-Air (OTA) or the nodes in the wireless network can be programmed optically, using for example LED light infrastructure or lasers or using a drone which can fly by. The firmware updates can be pushed using either light or flyby drones, or both, depending on the wireless network configuration (e.g., location, geometry, capacity, etc . . . ). Good software engineering design principles may need to be incorporated to ensure that the firmware updates don't constrict the wireless network capacity and or have a heavy power penalty. In this way, a dynamic wireless network can incorporate new personalities in an energy efficient manner.

As it can be appreciated from the above paragraphs, there is provided a crystal-free wireless device. The crystal-free wireless device includes a frequency calibration module; a local radio frequency (RF) oscillator having a first frequency and configured to communicate with the frequency calibration module; and a relaxation ring oscillator configured to communicate with the frequency calibration module. The relaxation ring oscillator is further configured to receive a calibration signal or periodic radio frequency packets from a wireless network and provide a reference signal to the frequency calibration module. The relaxation ring oscillator is a crystal-free oscillator. The frequency calibration module is configured to generate a calibration signal that is fed back through a Frequency Locked Loop (FLL) to the local RF oscillator to calibrate the local RF oscillator, as shown for example in FIG. 9. The calibrated local RF oscillator is configured to generate a clock signal. In an embodiment, the clock signal may be a radio clock signal.

In an embodiment, the frequency calibration module includes a counter configured to measure a divided frequency generated by dividing the first RF frequency based on the calibration signal from the relaxation ring oscillator. In an embodiment, the periodic RF packets are used to provide a timing reference to the frequency calibration module. In an embodiment, the clock signal comprises a 2 MHz frequency signal for IEEE 802.15.4, a 1 MHz frequency signal for the BLE, a ADC clock signal, discrete time signal processing, or a digital baseband processor clock, or any combination thereof.

In an embodiment, the local RF oscillator has a better jitter performance than the relaxation ring oscillator for generating the clock signal. The relaxation ring oscillator can include an RC-based oscillator. The local RF oscillator can include an LC-based oscillator.

According to an aspect of the present invention, there is also provided a wireless network. The wireless network has a plurality of nodes, one or more of the plurality of nodes being configured to generate a frequency calibration signal to calibrate a remaining plurality of nodes, as shown for example in FIG. 10. A first node in the plurality of nodes is configured to operate as a location server to provide a location service to the remaining plurality of nodes. A second node in the plurality of nodes is configured to operate as a time or frequency server to provide calibration time, calibration frequency or both to the remaining plurality of nodes. A third node in the plurality of nodes is configured to operate as a sensor calibration server to calibrate one or more physical property sensors. For example, the sensor calibration server can be more accurate than the one or more physical property sensors. For example, the one or more physical property sensors comprises a temperature sensor, a pressure sensor, a humidity sensor, a gas sensor, or a movement sensor, or any combination thereof.

In an embodiment, the second node includes a frequency calibration module; a local radio frequency (RF) oscillator having a first frequency and configured to communicate with the frequency calibration module; and a relaxation ring oscillator configured to communicate with the frequency calibration module. The relaxation ring oscillator is further configured to receive a calibration signal or periodic radio frequency packets from a wireless network and provide a reference signal to the frequency calibration module. The relaxation ring oscillator is a crystal-free oscillator. The frequency calibration module is configured to generate a calibration signal that is fed back through a Frequency Locked Loop (FLL) to the local RF oscillator to calibrate the local RF oscillator. The calibrated local RF oscillator is configured to generate a clock signal.

In an embodiment, one or more of the plurality of nodes are edge nodes, one or more of the plurality of nodes are access point nodes, and one or more of the plurality of nodes are gateway nodes. In an embodiment, the access point nodes or the gateway nodes comprise a crystal oscillator to generate an accurate time, frequency or both to calibrate the edge nodes that are crystal-free.

In an embodiment, the wireless network, shown for example in FIG. 10, is a dynamic wireless network. The dynamic wireless network is reconfigurable according to a position of one or more moving nodes in the wireless network, reconfigurable to accept a joining node, or reconfigurable to remove a leaving node, or any combination thereof. For example, the joining node can be configured to synchronize its time with the second node. The joining node can also be configured to act as a time or frequency server node. In an embodiment, a location of the joining node can be determined using the first node.

In an embodiment, a node in the wireless network uses the time or frequency server to synchronize its time with the time or frequency server and another node in the wireless network uses a time obtained from the first mentioned node to synchronize its time with the time of the first mentioned node, as shown for example in FIG. 13.

In an embodiment, the first node, the second or the third node or any combination thereof are configured to be updated using a firmware update to operate as a location server, a time or frequency server, or a calibration server in accordance to a desired configuration.

According to an aspect of the present invention, there is also provided a wireless network that includes a plurality of nodes, one or more of the plurality of nodes being configured to generate a frequency calibration signal to calibrate a remaining plurality of nodes. The one or more of the plurality of nodes includes a frequency calibration module; a local radio frequency (RF) oscillator having a first frequency and configured to communicate with the frequency calibration module; and a relaxation ring oscillator configured to communicate with the frequency calibration module. The relaxation ring oscillator being further configured to receive a calibration signal or periodic radio frequency packets from a wireless network and provide a reference signal to the frequency calibration module. The relaxation ring oscillator is a crystal-free oscillator. The frequency calibration module is configured to generate a calibration signal that is fed back through a Frequency Locked Loop (FLL) to the local RF oscillator to calibrate the local RF oscillator. The calibrated local RF oscillator is configured to generate a clock signal.

A further aspect of the present invention is to provide a crystal-free wireless device, including a frequency calibration module; and a local radio frequency (RF) oscillator having a first frequency and configured to communicate with the frequency calibration module to provide a reference signal to the frequency calibration module. The local radio frequency (RF) oscillator is a crystal-free oscillator. The frequency calibration module is configured to generate a calibration signal that is fed back to the local RF oscillator to calibrate the local RF oscillator. The calibrated local RF oscillator is configured to generate a clock signal.

REFERENCES

[1] G. Bell, "Bell's Law for the Birth and Death of Computer Classes: A theory of the Computer's Evolution," *IEEE Solid State Circuits Society Newsletter,* vol. 13, no. 4, pp. 8-19, 2008.

[2] Y. Lee, G. Chen, S. Hanson, D. Sylvester and D. Blaauw, "Ultra-low power circuit techniques for a new class of sub-mm3 sensor nodes," in *IEEE Custom Integrated Circuits Conference,* 2010.

[3] Q. Ju and Y. Zhang, "Clustered Data Collection for Internet of Batteryless Things," *IEEE Internet of Things Journal*, vol. 4, no. 6, pp. 2275-2285, December 2017.

[4] Y. Lee, S. Bang, I. Lee, Y. Kim, G. Kim, M. H. Ghaed, P. Pannuto, P. Dutta, D. Sylvester and D. Blaauw, "A Modular 1 mm2 Die-Stacked Sensing Platform With Low Power I2C Inter-Die Communication and Multi-Modal Energy Harvesting," *IEEE Journal of Solid State Circuits*, vol. 48, no. 1, pp. 229-243, January 2013.

[5] G. Kim, Y. Lee, Z. Foo, P. Pannuto, Y.-S. Kuo, B. Kempke, M. H. Ghaed, S. Bang, I. Lee, Y. Kim, S. Jeong, P. Dutta, D. Sylvester and D. Blaauw, "A millimeter-scale wireless imaging system with continuous motion detection and energy harvesting," in *IEEE VLSI Circuits Digest of Technical Papers*, Honolulu, Hi., 2014.

[6] O. Khan, B. Wheeler, D. Burnett, F. Maksimovic, S. Mesri, K. Pister and A. Niknejad, "Frequency reference for crystal free radio," in *IEEE International Frequency Control Symposium (IFCS)*, New Orleans, La., 2016.

[7] A. Paidimarri, D. Griffith, A. Wang, A. P. Chandrakasan and G. Burra, "A 120 nW 18.5 kHz RC oscillator with comparator offset cancellation for ±0.25% temperature stability," in *International Solid-State Circuits Conference Digest of Technical Papers*, San Francisco, Calif., 2013.

[8] D. Griffith, J. Murdock, P. T. Roine and T. Murphy, "A 37 μW dual-mode crystal oscillator for single-crystal radios," in *IEEE International Solid-State Circuits Conference—(ISSCC) Digest of Technical Papers*, San Francisco, Calif., 2015.

[9] Y. Tokunaga, S. Sakiyama and A. Matsumoto and S. Dosho, "An On-Chip CMOS Relaxation Oscillator With Voltage Averaging Feedback," *IEEE Journal of Solid-State Circuits*, vol. 45, no. 6, pp. 1150-1158, June 2010.

[10] K. Sundaresan, P. E. Allen and F. Ayazi, "Process and temperature compensation in a 7-MHz CMOS clock oscillator," *IEEE Journal of Solid State Circuits*, vol. 41, no. 2, pp. 433-442, February 2006.

[11] J. Lee and S. Cho, "A 10 MHz 80 μW 67 ppm/° C. CMOS reference clock oscillator with a temperature compensated feedback loop in 0.18 μm CMOS," in *IEEE Symposium on VLSI Circuits*, 2009.

[12] S. Mesri, "Design and User Guide for the Single Chip Mote Digital System," May 2016.

[13] D. W. Allan, "Conversion of Frequency Stability Measures from the Time-domain to the Frequency-domain, vice-versa and Power-law Spectral Densities," Jan. 26, 2012.

[14] B. P. Lechêne, M. Cowell, A. Pierre, J. W. Evans, P. K. Wright and A. C. Arias, "Organic solar cells and fully printed super-capacitors optimized for indoor light energy harvesting," *Nano Energy*, vol. 26, pp. 631-640, August 2016.

[15] N. Shafiee, S. Tewari, B. Calhoun and A. Shrivastava, "Infrastructure Circuits for Lifetime Improvement of Ultra-Low Power IoT Devices," *IEEE Transactions on Circuits and Systems I*, vol. 64, no. 9, pp. 2598-2610, September 2017.

[16] M. Ding, Y.-H. Liu, Y. Zhang, C. Lu, P. Zhang, B. Busze, C. Bachmann and K. Philips, "A 95 μW 24 MHz digitally controlled crystal oscillator for IoT applications with 36 nJ start-up energy and >13× start-up time reduction using a fully-autonomous dynamically-adjusted load," in *IEEE International Solid-State Circuits Conference (ISSCC)*, San Francisco, Calif., 2017.

[17] D. Dujovne, T. Watteyne, X. Vilajosana and P. Thubert, "6TiSCH: deterministic IP-enabled industrial internet (of things)," *IEEE Communications Magazine*, vol. 52, no. 12, pp. 36-41, December 2014.

[18] Wikipedia, "Speed," [Online]. Available: https://en.wikipedia.org/wiki/Speed. [Accessed 23 Feb. 2018].

[19] G. Kim, Y. Lee, S. Bang, I. Lee, Y. Kim, D. Sylvester and D. Blaauw, "A 695 pW standby power optical wake-up receiver for wireless sensor nodes," in *IEEE Custom Integrated Circuits Conference*, San Jose, Calif., 2012.

The embodiments illustrated and discussed in this specification are intended only to teach those skilled in the art how to make and use the invention. In describing embodiments of the disclosure, specific terminology is employed for the sake of clarity. However, the disclosure is not intended to be limited to the specific terminology so selected. The above-described embodiments of the disclosure may be modified or varied, without departing from the invention, as appreciated by those skilled in the art in light of the above teachings. It is therefore to be understood that, within the scope of the claims and their equivalents, the invention may be practiced otherwise than as specifically described. For example, it is to be understood that the present invention contemplates that, to the extent possible, one or more features of any embodiment can be combined with one or more features of any other embodiment.

We claim:

1. A crystal-free wireless device, comprising:
a frequency calibration module;
a local radio frequency (RF) oscillator having a first frequency and configured to communicate with the frequency calibration module; and
a relaxation ring oscillator configured to communicate with the frequency calibration module, the relaxation ring oscillator being further configured to receive a calibration signal or periodic radio frequency packets from a wireless network and provide a reference signal to the frequency calibration module,
wherein the relaxation ring oscillator is a crystal-free oscillator,
wherein the frequency calibration module is configured to generate a calibration signal that is fed back through a Frequency Locked Loop (FLL) to the local RF oscillator to calibrate the local RF oscillator, and
wherein the calibrated local RF oscillator is configured to generate a clock signal.

2. The device according to claim 1, wherein the clock signal comprises a radio clock signal.

3. The device according to claim 1, wherein the frequency calibration module comprises a counter configured to measure a divided frequency generated by dividing the first RF frequency based on the calibration signal from the relaxation ring oscillator.

4. The device according to claim 1, wherein the periodic RF packets are used to provide a timing reference to the frequency calibration module.

5. The device according to claim 1, wherein the clock signal comprises a 2 MHz frequency signal for IEEE 802.15.4, a 1 MHz frequency signal for the BLE, a ADC clock signal, discrete time signal processing, or a digital baseband processor clock, or any combination thereof.

6. The device according to claim 1, wherein the local RF oscillator has a better jitter performance than the relaxation ring oscillator for generating the clock signal.

7. The device according to claim 1, wherein the relaxation ring oscillator comprises an RC-based oscillator.

8. The device according to claim 1, wherein the local RF oscillator comprises an LC-based oscillator.

9. A wireless network comprising:
a plurality of nodes, one or more of the plurality of nodes being configured to generate a frequency calibration signal to calibrate a remaining plurality of nodes,
wherein the one or more of the plurality of nodes comprises:
a frequency calibration module;
a local radio frequency (RF) oscillator having a first frequency and configured to communicate with the frequency calibration module; and
a relaxation ring oscillator configured to communicate with the frequency calibration module, the relaxation ring oscillator being further configured to receive a calibration signal or periodic radio frequency packets from a wireless network and provide a reference signal to the frequency calibration module,
wherein the relaxation ring oscillator is a crystal-free oscillator,
wherein the frequency calibration module is configured to generate a calibration signal that is fed back through a Frequency Locked Loop (FLL) to the local RF oscillator to calibrate the local RF oscillator, and
wherein the calibrated local RF oscillator is configured to generate a clock signal.

10. A crystal-free wireless device, comprising:
a frequency calibration module; and
a local radio frequency (RF) oscillator having a first frequency and configured to communicate with the frequency calibration module to provide a reference signal to the frequency calibration module,
wherein the local radio frequency (RF) oscillator is a crystal-free oscillator,
wherein the frequency calibration module is configured to generate a calibration signal that is fed back to the local RF oscillator to calibrate the local RF oscillator, and
wherein the calibrated local RF oscillator is configured to generate a clock signal.

* * * * *